(12) United States Patent
Taguchi et al.

(10) Patent No.: US 6,191,031 B1
(45) Date of Patent: Feb. 20, 2001

(54) PROCESS FOR PRODUCING MULTI-LAYER WIRING STRUCTURE

(75) Inventors: Mitsuru Taguchi, Tokyo; Shingo Kadomura, Kanagawa, both of (JP)

(73) Assignee: Sony Corporation, Tokyo (JP)

( * ) Notice: Under 35 U.S.C. 154(b), the term of this patent shall be extended for 0 days.

(21) Appl. No.: 09/395,596

(22) Filed: Sep. 14, 1999

(30) Foreign Application Priority Data

Sep. 16, 1998 (JP) .................................................. 10-261048

(51) Int. Cl.[7] .................................................. H01L 21/4763
(52) U.S. Cl. .......................... 438/642; 438/639; 438/638
(58) Field of Search ..................................... 438/637, 780, 438/639, 687, 688, 638, 634, 640, 642

(56) References Cited

U.S. PATENT DOCUMENTS 5,883,002 * 3/1999 Shih et al. .
5,924,004 * 7/1999 Hsu .
6,027,994 * 2/2000 Huang et al. .

* cited by examiner

*Primary Examiner*—Tuan H. Nguyen
(74) *Attorney, Agent, or Firm*—Ronald P. Kananen; Rader, Fishman & Grauer

(57) ABSTRACT

Upon forming a groove and a connection hole by a dual damascene process, there is a problem in that the connection hole has a bowing shape, and it is difficult to form a shape of the connection hole in a good and stable manner. A process for producing a multi-layer wiring structure is provided, which comprises a step of forming an inter level dielectric film 15 covering a lower layer wiring 14; a step of forming a connection hole 16 in the inter level dielectric film 15 to reach the lower layer wiring 14; a step of forming an inter metal dielectric film 17 filling the connection hole 16 on the inter level dielectric film 15, with an insulating material having an etching rate larger than an etching rate of the inter level dielectric film 15; and a step of forming a concave part 18 in the inter metal dielectric film 17, and selectively re-opening the connection hole 16 with respect to the inter level dielectric film in such a manner that the connection hole is continuous to the concave part 18.

8 Claims, 4 Drawing Sheets

PROCESS FOR PRODUCING MULTI-LAYER WIRING STRUCTURE

FIELD OF THE INVENTION

The present invention relates to a process for producing a multi-layer wiring structure, and more particularly, it relates to a process for producing a multi-layer wiring structure, in which a shape of a contact hole in a so-called dual damascene process is improved.

BACKGROUND OF THE INVENTION

With the increase of minuteness and high-speed operation of an LSI, there are demands of a low resistance of a wiring and a low dielectric constant of an inter level dielectric film. In order to cope with the demands, a copper wiring having a lower resistance than the conventional aluminum alloy wiring, and various organic material f or the insulating film having a lower dielectric constant than the conventional silicon oxide ($SiO_2$) film have been investigated to turn them to practical use.

As a technique f or forming a copper wiring, a method using a so-called groove wiring is receiving attention since dry etching of copper is generally difficult. As a technique for forming the groove wiring, a method has been proposed, in which after embedding a wiring material in a contact hole, a groove is formed, and then a wiring material is embedded in the groove (a so-called single damascene process), and furthermore another method has also been proposed, in which both a contact hole and a groove are formed, and then a wiring material is embedded simultaneously in both the contact hole and the groove (a so-called dual damascene process). The dual damascene process has an advantage in cost because an embedding step of a wiring material and a chemical mechanical polishing (CMP) step after the embedding step are conducted only once.

Various methods have been proposed as a method for forming a contact hole and a groove in the dual damascene process. A typical method includes both a method where a groove is formed after forming a contact hole, and a method where a contact hole is formed after forming a groove. In these methods, because a photoresist pattern is formed on a step part, such as the contact hole and the groove having been opened, a problem in defective shape of the photoresist pattern occurs. As an example of a method for solving the problem, a method, in which an etching stop layer having a via hole having been opened therein is embedded, has been proposed. This method will be described with reference to FIGS. 1(A) and 1(B).

As shown in FIG. 1(A), a lower layer copper wiring 112 is formed in a first insulating film 111 to be an insulating film among the lower layer wirings on a substrate 110. A silicon nitride film as a copper diffusion preventing layer 113 is formed on the lower layer copper wiring 112 and the first insulating film 111, and then a CVD-$SiO_2$ film as an insulating film 114 between the wiring layers. A silicon nitride film as an etching stop layer 115 is accumulated. A part of a contact hole 116 is then formed on the etching stop layer 115 by conducting a resist coating step, a lithography step and an etching step.

Thereafter, as shown in FIG. 1(B), a CVD-$SiO_2$ film as a second insulating film 117 to be an insulating film among an upper layer wiring is formed on the etching stop layer 115 to fill the contact hole 116. A resist mask (not shown in the figure) is formed by patterning to form an opening for forming a groove by conducting a resist coating step and a lithography step. A groove 118 is formed in the second insulating film 117 by conducting a reactive ion etching step using the resist mask. Etching is further conducted using the etching stop layer. 115 as an etching mask to complete the contact hole 116 that penetrates the insulating film 114 and the diffusion preventing film 113, and reaches the lower layer copper wiring 112.

However, even in the case of the production method according to the conventional technique described above with reference to FIGS. 1(A) and 1(B), there is a problem in that the connection hole is liable to have a bowing shape, in which the cross sectional shape largely changes in the depth direction. This is because since the opening area of the connection hole is extremely small in comparison to the opening area of the groove, and when etching of the groove is completed and is switched to etching of the connection hole, radicals in the plasma are concentrated at the connection hole of a small area to cause excessive etching. Furthermore, because the etching rate of the groove becomes uneven within the wafer surface, it is difficult to stably prevent the occurrence of the bowing shape.

SUMMARY OF THE INVENTION

An object of the invention is to provide a process for producing a multi-layer wiring structure that solves the problems described above, the process comprising: a step of forming an inter level dielectric film covering a lower layer wiring; a step of forming a connection hole in the inter level dielectric film to reach the lower layer wiring; a step of forming an inter metal dielectric film filling the connection hole on the inter level dielectric film, with an insulating material having an etching rate larger than that of the inter level dielectric film; and a step of forming a concave part in the inter metal dielectric film, and selectively re-opening the connection hole with respect to the inter level dielectric film in such a manner that the connection hole is continuous to the concave part.

In the process for producing a multi-layer wiring structure of the invention, because only a connection hole is formed in the inter level dielectric film first, the connection hole does not have a bowing shape, in which the cross sectional shape largely changes in the depth direction, but has a shape having a small change in cross section excellent in anisotropy through etching. In the course of forming the concave part and the connection hole in the inter metal dielectric film and the inter level dielectric film, when the etching is switched from formation of the concave part to formation of the connection hole, radicals in the plasma are concentrated to the connection hole of a small area. However, because the inter metal dielectric film filled in the connection hole has a larger etching rate than the inter level dielectric film, i.e., the etching selectivity of the inter level dielectric film is sufficiently large with respect to the inter metal dielectric film, only the inter metal dielectric film filled in the connection hole is selectively etched. Accordingly, the connection hole completed does not have a so-called bowing shape.

DESCRIPTION OF PREFERRED EMBODIMENTS

One embodiment of the process for producing a multi-layer wiring structure according to the invention will be described with reference to FIGS. 2(A) to 2(D).

Figure 1A:
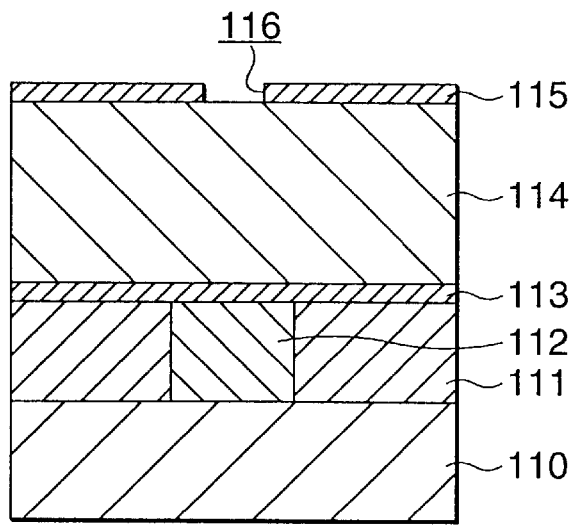
FIGS. 1(A) and 1(B) are schematic cross sectional views showing the conventional process for producing a multi-layer wiring structure.
Figure 1B:
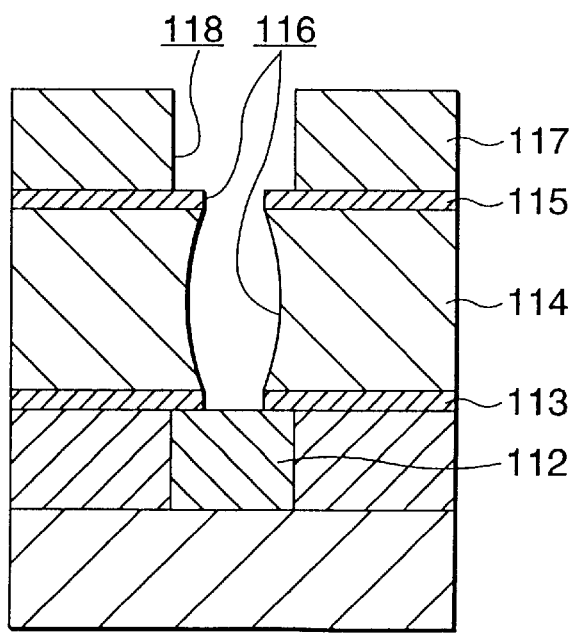
Figure 2A:
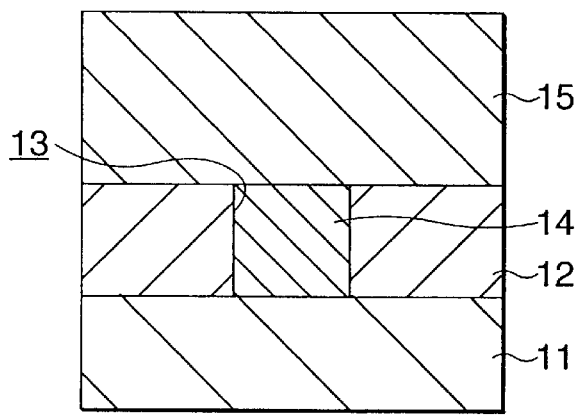
FIGS. 2(A) to 2(D) are schematic cross sectional views showing one embodiment of the process for producing a multi-layer wiring structure according to the invention.

As shown in FIG. 2(A), a groove 13 is formed in a first insulating film 12 on a substrate 11, and an inter level dielectric film 15 is formed to cover a lower layer wiring 14 provided in the groove 13. The inter level dielectric film 15 will serve as an insulating film between the lower layer wiring 14 and an upper layer wiring which will be formed later.

Figure 2C:
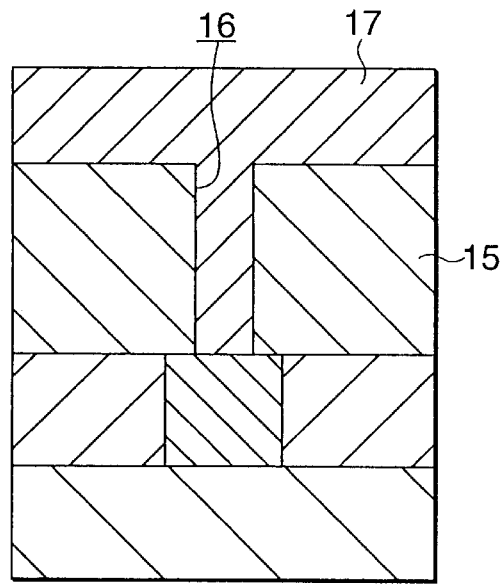
Figure 2B:
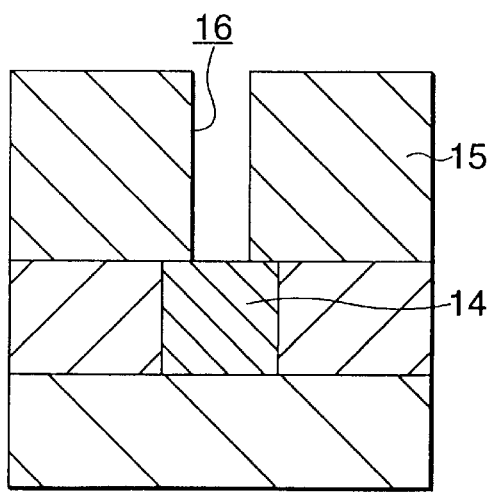

As shown in FIG. 2(B), after forming an etching mask (not shown in the figure) with a resist through coating a resist and a lithography technique, reactive ion etching (hereinafter referred to as RIE), for example, is conducted using the etching mask to form a contact hole 16 in the inter level dielectric film 15 to reach the lower layer wiring 14. After the etching, the resist mask is removed.

As shown in FIG. 2(C), an inter metal dielectric film 17 is formed to fill the connection hole on the inter level dielectric film 15, with an insulating material having an etching rate larger than the etching rate of the inter level dielectric film 15.

Figure 2D:
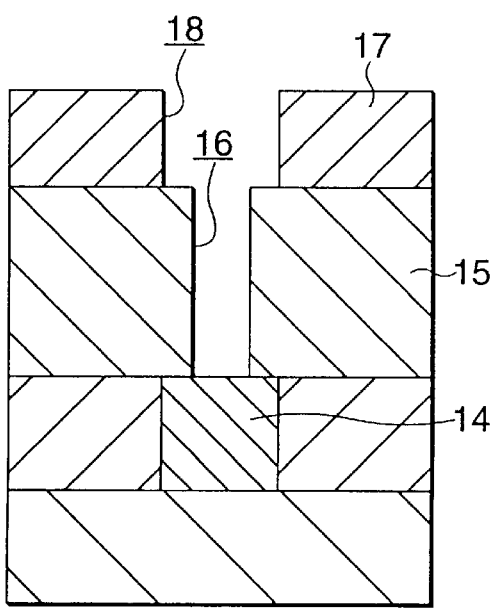

As shown in FIG. 2(D), a concave part 18 (for example, a groove) is formed in the inter metal dielectric film 17 by etching, and at the same time, the connection hole 16 is re-opened in the inter level dielectric film 15 in such a manner that the connection hole 16 is continuous to the concave part 18 to reach the lower layer wiring 14.

Thereafter, while not shown in the figure, a tantalum nitride film having a thickness of, for example, 50 nm is formed as a barrier metal on the respective inner surfaces of groove 18 and the connection hole 16 and on the inter level dielectric film 17, and a copper film having a thickness of, for example, 100 nm to be a seed of a copper plating is then formed. Copper is embedded inside the groove 18 and the connection hole 16 by a copper electrolytic plating method, and excessive copper and the tantalum nitride film on the inter level dielectric film 17 are removed by a CMP method to form an upper layer wiring comprising copper inside the groove 18, and at the same time, to form a plug comprising copper inside the connection hole 16.

In the case where the inter metal dielectric films 12 and 17 are formed with an organic insulating material, and the groove 13 and the concave part 18 are formed by etching, the etching is generally conducted by using a so-called hard mask comprising a material having an etching resistance, such as a silicon oxide material.

In the process for producing a multi-layer wiring structure described above, because only the connection hole 16 is formed in the inter level dielectric film 15 at the initial stage, the connection hole 16 does not have a bowing shape, in which the cross sectional shape largely changes in the depth direction, but has a shape having small change in cross section excellent in anisotropy through etching. In the course of forming the concave part 18 (for example, a groove) and the connection hole 16 in the inter metal dielectric film 17 and the inter level dielectric film 15, when the etching is switched from formation of the concave part 18 to formation of the connection hole 16, radicals in the plasma are concentrated at the connection hole 16 of a small area. However, because the inter metal dielectric film 17 filled in the connection hole 16 has a larger etching rate than the inter level dielectric film 15, i.e., the etching selectivity of the inter level dielectric film 15 is sufficiently large with respect to the inter metal dielectric film 17, only the inter metal dielectric film 17 filled in the connection hole 16 is selectively etched. Accordingly, the connection hole 16 completed does not have a bowing shape, but has a shape having small change in cross section excellent in anisotropy.

Therefore, the concave part 18 (for example, a groove) and the connection hole 16 can be stably processed by using, for example, an organic insulating film having a low dielectric constant for the inter metal dielectric films 12 and 17, and a silicon insulating film having a low dielectric constant exhibiting a lower etching rate than the inter metal dielectric film 17 for the inter level dielectric film 15. Accordingly, a dual damascene wiring can be formed at a high yield while also suppressing a wiring delay.

An example, in which the process for producing a multi-layer wiring structure described with reference to the embodiment is applied to a process for producing a dual damascene structure, will be described with reference to FIGS. 3(A) to 3(E) and 4(F) to 4(H). In FIGS. 3(A) to 3(E) and 4(F) to 4(H), the same symbols are attached to the same parts in FIGS. 2(A) to 2(D).

Figure 3A:
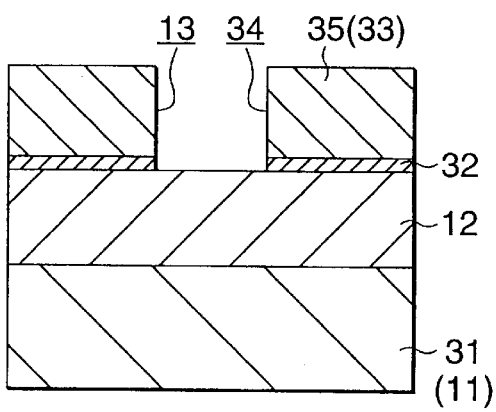
FIGS. 3(A) to 3(E) and 4(F) to 4(H) are schematic cross sectional views showing an example where the process for producing a multi-layer wiring structure according to the invention is applied to a process for producing a dual damascene structure.

As shown in FIG. 3(A), after forming a prescribed device (not shown in the figure) on a semiconductor substrate (not shown in the figure), a substrate 11 having an inter level dielectric film 31 comprising, for example, an $SiO_2$ film is prepared. A polyallylether resin, an organic insulating film having a low dielectric constant, is then formed on the inter level dielectric film 31 to have a thickness of 500 nm by, for example, a spin coating method, and the coating film is cured at 400° C. to form an inter metal dielectric film (hereinafter referred to as IMD) 12 to be an inter level dielectric film of the lower layer wiring. A hard mask 32 is formed by forming a film of an insulating material mainly comprising a substance represented by formula $SiO_x(CH_3)_y$ ($1 \leq x \leq 2$, $0.2 \leq y \leq 2$) as a silicon oxide having a low dielectric constant, having a thickness of 100 nm by, for example, a CVD method. Upon forming the film, $H_2O_2$ (flow rate: 100 sccm) and monomethylsilane (flow rate: 10 sccm) are used as process gases; the temperature of the substrate is set at 0° C.; and the pressure of the film forming atmosphere is set at 13 kPa.

A resist film 33 is formed through a process containing coating a photoresist and baking, and an opening 34 for opening a groove is formed in the resist film 33 by a lithography technique to form a resist mask 35. A part of a groove 13 is formed in the hard mask 32 by etching using the resist mask 35.

The IMD 12 is subjected to RIE by using the resist mask 35 and the hard mask 32 as an etching mask. As a result, the groove 13 is formed in the hard mask 32 and IMD 12 as shown in FIG. 3(B). Upon conducting RIE, for example, an ECR (electron cyclotron resonance) plasma etching apparatus is used under the conditions that nitrogen (flow rate: 40 sccm) and helium (flow rate: 165 sccm) are used as etching gases; the pressure of the etching atmosphere is set at, for example, 0.8 Pa; the microwave power is set at, for example, 500 W (2.45 GHz); an RF power is set at, for example, 100 W; and the temperature of the substrate is set at, for example, −50° C. The unit "sccm" used herein means a volume flow rate ($cm^3$/min) under the normal state.

Upon conducting the RIE above, because the etching characteristics of the IMD 12 and the resist film are close to each other, the resist mask 35 is removed by etching in a short period of time. Therefore, in the part where the resist mask 35 is removed, the hard mask 32 functions as an etching mask.

Figure 3D:
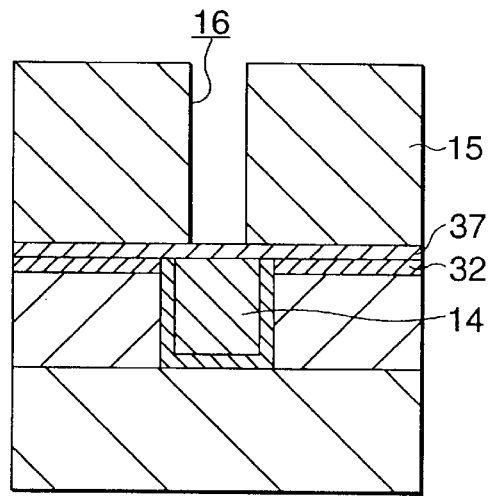
Figure 3B:
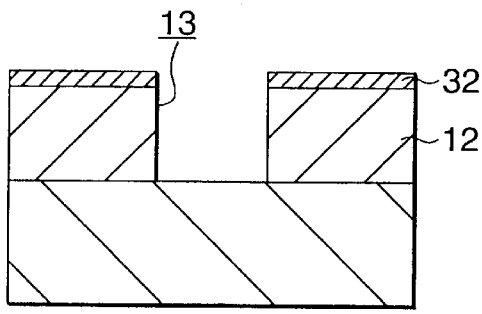
Figure 3C:
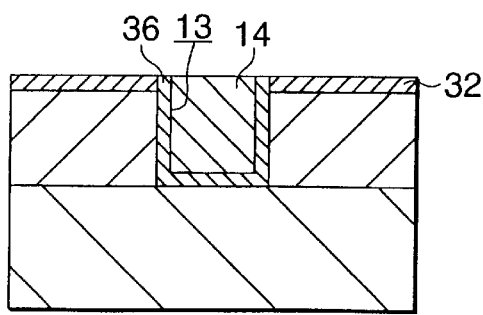

As shown in FIG. 3(C), a tantalum nitride film 36 having a thickness of, for example, 50 nm is formed on the inner surface of the groove 13 and on the hard mask 32 by, for example, a DC magnetron sputtering method, and a copper film having a thickness of, for example, 100 nm is then formed. The copper film will be a seed of copper plating formed in a later step. The conditions of forming the tantalum nitride film 36 are, for example, that argon (flow rate: 60 sccm) and nitrogen (flow rate: 40 sccm) are used as process gases; the pressure of the film forming atmosphere is set at 0.4 Pa; the temperature of the substrate is set at 200° C.; and the DC power is set at 6 kW. The conditions of forming the copper film are, for example, that argon (flow rate: 100 sccm) is used as process gases; the pressure of the film forming atmosphere is set at 0.4 Pa; the temperature of the substrate is set at 100° C.; and the DC power is set at 12 kW.

Copper is embedded in the groove 13 by a copper electrolytic plating method, and then excessive copper and the tantalum nitride film 36 on the hard mask 32 are removed by a CMP method to form a lower layer wiring 14 comprising copper inside the groove 13. Therefore, the surface of the lower layer wiring 14 and the surface of the hard mask 32 form one plane having been flattened. In the figure, the lower layer wiring 14 is shown as the copper film formed as the seed and the copper formed by the copper electrolytic plating method being united.

As shown in FIG. 3(D), a barrier layer 37 for preventing diffusion of copper is formed with, for example, a silicon nitride film on the lower layer wiring 14 and the hard mask 32. An inter level dielectric film (hereinafter referred to as ILD) 15 between the upper layer wiring and the lower layer wiring is formed on the barrier layer 37 by accumulating a silicon oxide mainly comprising, for example, $SiO_x(CH_3)_y$ to a thickness of 1 μm. The formation of the ILD 15 is conducted in the similar manner as the hard mask 32.

Thereafter, a resist mask (not shown in the figure) having an opening for opening the connection hole is formed in the similar manner as the formation of the resist mask 35. The connection hole 16 is formed in the ILD 15 by etching using the resist mask. The resist mask is then removed.

Figure 3E:
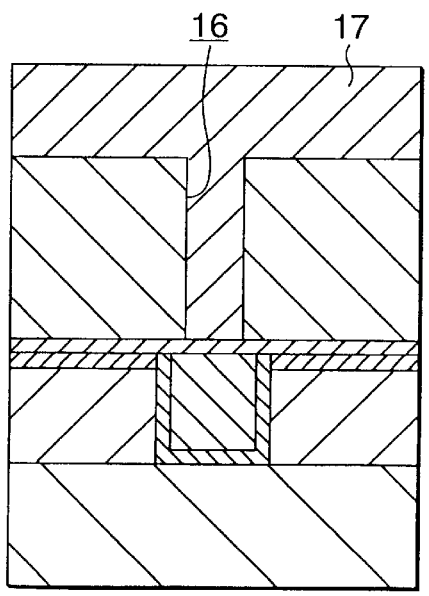

As shown in FIG. 3(E), an inter metal dielectric film (IMD) 17 to be an inter level dielectric film of the upper layer wiring is formed on the ILD 15 to fill the connection hole 16, with, for example, a polyallylether resin which is an organic insulating film having a low dielectric constant. The IMD 17 is formed in the similar manner as the formation of the IMD 12. While it is not necessary to completely fill the connection hole 16 with the IMD 17, it is preferred that the connection hole 16 is filled up by the IMD 17.

Figure 4F:
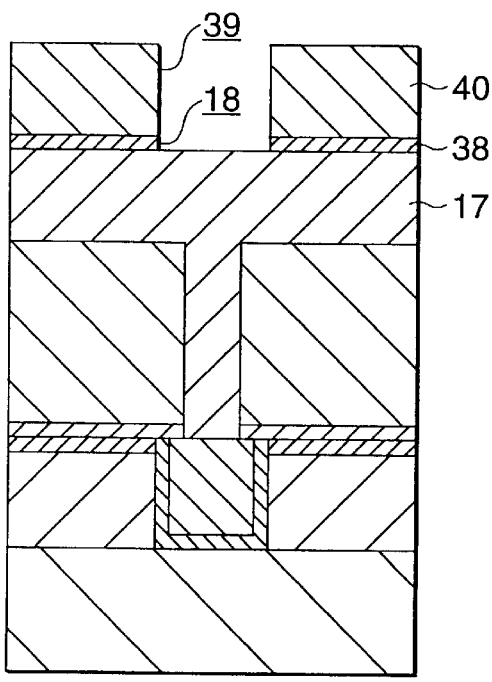

As shown in FIG. 4(F), a hard mask 38 is formed by forming, for example a silicon oxide mainly comprising $SiO_x(CH_3)_y$ to have a thickness of 100 nm on the IMD 17 by, for example, a CVD method. Thereafter, a resist mask 40 having an opening 39 for opening a groove is formed in the similar manner as the formation of the resist mask 35. A part of the groove 18 is formed in the hard mask 38 by etching using the resist mask 40.

Figure 4H:
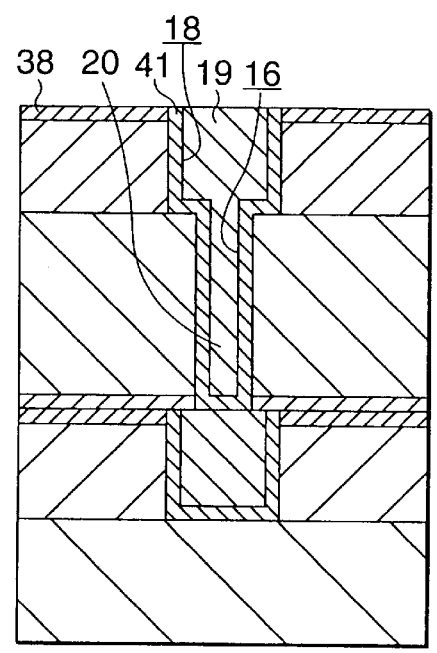
Figure 4G:
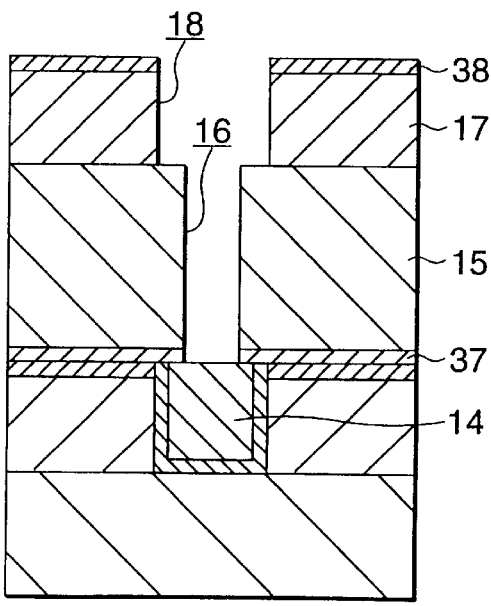

AS shown in FIG. 4(G), the IMD 17 is subjected to RIE by using the resist mask 40 (not shown in the figure) and the hard mask 38 as an etching mask, to form the groove 18 in the IMD 17. The connection hole 16 is re-opened in the ILD 15 by RIE using the ILD 15 as an etching mask. In the RIE, an ECR plasma etching apparatus, for example, is used, and the etching conditions are, for example, that nitrogen (flow rate: 40 sccm) and helium (flow rate: 165 sccm) are used as etching gases; the pressure of the etching atmosphere is set at 0.8 Pa; the microwave power is set at 500 W (2.45 GHz); the RF power is set at 100 W; and the temperature of the substrate equipped with an electrode is set at −50° C. Subsequently, the barrier layer 37 comprising a silicon nitride film is also etched to open the connection hole 16 to reach the lower layer wiring 14.

Thereafter, as shown in FIG. 4(H), a tantalum nitride film 41 having a thickness of, for example, 50 nm to be a barrier metal is formed on the inner surfaces of the groove 18 and the connection hole 16 and on the hard mask 38 by, for example, a DC magnetron sputtering method, and a copper film having a thickness of, for example, 100 nm is then formed. The copper film will be a seed of copper plating formed in a later step. The formation conditions of the tantalum nitride film 41 are similar to the formation conditions of the tantalum nitride film 36 described with reference to FIG. 3(C), and the formation conditions of the copper film are the similar to the formation conditions of the copper film described with reference to FIG. 3(C).

Subsequently, copper is filled inside the groove 18 and the connection hole 16 by a copper electrolytic plating method, and then excessive copper and the tantalum nitride film 41 on the hard mask 38 are removed by a CMP method to form an upper layer wiring 19 comprising copper inside the groove 18, and at the same time, to form a plug 20 comprising copper inside the connection hole 16. Accordingly, the surface of the upper layer wiring 19 and the surface of the hard mask 38 form one plane having been flattened. In the figure, the copper film formed as the seed and the copper formed by the copper electrolytic plating method are united as shown as the upper layer wiring 19 and the plug 20.

In the production process described above, while the barrier layer 37 comprising a silicon nitride film is formed on the lower layer wiring 14, the barrier layer 37 is not necessarily formed. For example, in the case where the inter metal dielectric film 17 is formed with a material, in which copper is difficult to diffuse, and in the case where the wiring material is formed with an aluminum material, the barrier layer 37 may not be formed.

In the production process in which the invention is applied to a dual damascene process, described with reference to FIGS. 3(A) to 3(E) and 4(F) to 4(H), because only the connection hole 16 is formed in the ILD 15 first, the connection hole 16 has a shape having a small change in cross section excellent in anisotropy through etching. In the course of opening the concave part (groove) 18 and the connection hole 16 in the IMD 17 and the ILD 15, when the etching is switched from formation of the concave part 18 to formation of the connection hole 16, radicals in the plasma are concentrated to the connection hole 16 of a small area. However, because the IMD 17 filled in the connection hole 16 has a larger etching rate than the ILD 15, only the IMD 17 filled in the connection hole 16 is selectively etched, and thus the connection hole 16 completed does not have a bowing shape. Accordingly, the conventional problem associated with the dual damascene process is solved.

In the production process described with reference to FIGS. 3(A) to 3(E) and 4(F) to 4(H), an insulating material mainly comprising a copolymer of silanol ($SiO(CH_3)$) and a substance represented by formula $CH_xF_y$ ($0 \leq x \leq 2, 0 \leq y \leq 2$) may be used as the hard mask 32 and the ILD 15, as well as the silicon oxide mainly comprising a substance represented by formula $SiO_x(CH_3)_y$ ($1 \leq x \leq 2$, $0.2 \leq y \leq 2$). The copolymer can be accumulated by, for example, coating the copolymer on a substrate by a spin coating method, drying at 100° C., and then annealing at 300° C. Nanoporous silica may also be used. The nanoporous silica can be accumulated by, for example, coating the nanoporous silica on a substrate by a spin coating method, aging at 100° C., drying at 100° C., and then annealing at 300° C.

While the IMDs 12 and 17 are formed with a polyallylether resin, the organic insulating film having a low dielectric constant may be formed with other materials, such as a cyclic fluorine resin, a siloxane copolymer, a fluorinated polyallylether resin, polypentafluorostyrene, a polytetrafluorostyrene resin, a fluorinated polyimide resin, polynaphthalene fluoride and a polycide resin.

As the materials for the wiring and the plug, conductive materials including copper alloy, such as copper-zirconium, aluminum, and aluminum alloy, such as aluminum-silicon, aluminum-silicon-copper and aluminum-copper, may also be used in addition to copper.

The barrier metal for copper may be formed with a tantalum film, a titanium nitride film, a tungsten film, a tungsten nitride film and a tungsten nitride silicide film, as well as the tantalum nitride film.

While the ECR plasma etching apparatus is used as etching apparatus, an etching apparatus of any type may be used as far as it realizes RIE. The etching conditions referred in the embodiments described above are mere examples and may vary as far as the objects of the invention can be attained.

In the invention, as described in the foregoing, because a connection hole is previously formed in an inter level dielectric film, the connection hole can have a shape having small change in cross section in the depth direction. After the inter metal dielectric film filling the connection hole is formed on the inter level dielectric film with an insulating material having a larger etching rate than the etching rate of the inter level dielectric film, a concave part is formed in the inter metal dielectric film, and the connection hole is selectively re-opened with respect to the inter level dielectric film. Thus, only the inter metal dielectric film filled in the connection hole can be selectively etched to form a connection hole having small change in cross section in the depth direction. Therefore, a connection hole does not have a defective shape, such as a bowing shape, in the so-called dual damascene process, and a groove and a connection hole having a good shape can be stably produced. Accordingly, a groove and a connection hole can be stably formed in a material of an inter level dielectric film having a low dielectric constant. As a result, a dual damascene wiring can be formed at a high yield and while suppressing a wiring delay.

What is claimed is:

1. A process for producing a multi-layer wiring structure comprising:
    a step of forming an inter level dielectric film covering a lower layer wiring;
    a step of forming a connection hole in said inter level dielectric film to reach said lower layer wiring;
    a step of forming an inter metal dielectric film filling said connection hole on said inter level dielectric film, with an insulating material having an etching rate larger than an etching rate of said inter level dielectric film; and
    a step of forming a concave part in said inter metal dielectric film, and selectively re-opening said connection hole with respect to said inter level dielectric film in such a manner that said connection hole is continuous to said concave part.

2. A process for producing a multi-layer wiring structure as claimed in claim 1, wherein said inter level dielectric film comprises an insulating material mainly comprising a substance represented by formula $SiO_x(CH_3)_y$, a copolymer of silanol and a substance represented by formula $CH_xF_y$, or nanoporous silica.

3. A process for producing a multi-layer wiring structure as claimed in claim 2, wherein said inter metal dielectric film comprises an organic insulating material.

4. A process for producing a multi-layer wiring structure as claimed in claim 3, wherein said process further comprises a step of filling a conductive material inside said concave part and said connection hole, to form a plug inside said connection hole and to form a wiring inside said concave part.

5. A process for producing a multi-layer wiring structure as claimed in claim 2, wherein said process further comprises a step of filling a conductive material inside said concave part and said connection hole, to form a plug inside said connection hole and to form a wiring inside said concave part.

6. A process for producing a multi-layer wiring structure as claimed in claim 1, wherein said inter metal dielectric film comprises an organic insulating material.

7. A process for producing a multi-layer wiring structure as claimed in claim 6, wherein said process further comprises a step of filling a conductive material inside said concave part and said connection hole, to form a plug inside said connection hole and to form a wiring inside said concave part.

8. A process for producing a multi-layer wiring structure as claimed in claim 1, wherein said process further comprises a step of filling a conductive material inside said concave part and said connection hole, to form a plug inside said connection hole and to form a wiring inside said concave part.

* * * * *